United States Patent [19]

Reding et al.

[11] Patent Number: 4,772,936
[45] Date of Patent: Sep. 20, 1988

[54] PRETESTABLE DOUBLE-SIDED TAB DESIGN

[75] Inventors: Bennett J. Reding, Colorado Springs, Colo.; Chandler H. McIver, Tempe, Ariz.

[73] Assignee: United Technologies Corporation, Hartford, Conn.

[21] Appl. No.: 35,210

[22] Filed: Apr. 7, 1987

Related U.S. Application Data

[63] Continuation of Ser. No. 653,796, Sep. 24, 1987, abandoned.

[51] Int. Cl.⁴ .................................. H01L 39/02
[52] U.S. Cl. ..................... 357/80; 174/52 FP; 357/40; 357/45; 357/70; 357/74
[58] Field of Search ............. 357/80, 40, 45, 79, 357/70, 74, 69; 174/52 FP

[56] References Cited

U.S. PATENT DOCUMENTS

| | | | |
|---|---|---|---|
| 4,259,436 | 3/1981 | Tabuchi et al. | 357/70 |
| 4,380,042 | 4/1983 | Angelucci et al. | 357/70 |
| 4,423,468 | 12/1983 | Gatto et al. | 174/52 FP |

Primary Examiner—William L. Sikes
Assistant Examiner—Georgia Y. Epps
Attorney, Agent, or Firm—Eric W. Petraske

[57] ABSTRACT

In a packaged electronic circuit, the circuit or circuits is soldered to a flexible tape, then tested and, any defective elements replaced. The tape is then soldered to a package. Different tapes may be used to change the pin-out of a chip; or to accomodate two sets of chips having different contact arrays.

5 Claims, 2 Drawing Sheets

PRETESTABLE DOUBLE-SIDED TAB DESIGN

This application is a continuation of application Ser. No. 653,796, filed on Sept. 24, 1987, and is now abandoned.

TECHNICAL FIELD

The field of the invention is that of packaging and testing integrated circuits.

BACKGROUND ART

U.S. Pat. No. 4,177,519 illustrates a single-sided tape mounting system, in which integrated circuits are mounted through apertures in a tape and bonded by thermo-compression bonding to metal layers on the tape. Integrated circuits and other devices may be combined.

U.S. Pat. No. 4,306,925 illustrates a double-sided flexible circuit board.

DISCLOUSRE OF INVENTION

The invention relates to a packaging system for integrated circuits providing for convenient pretest of the integrated circuit or system before the packaging operation.

A feature of the invention is that test pads are provided to facilitate testing before the integrated circuit is packaged.

Another feature of the invention is the replacement of defective components within a plurality of devices mounted on a tape.

Another feature of the invention is the use of different size chips with the same tape.

Another feature of the invention is the ability to customize the pin-out of a particular integrated circuit.

BEST MODE OF CARRYING OUT THE INVENTION

In particular applications of integrated circuits in which ceramic packages are used for the integrated circuit, it can happen that the cost of the ceramic package is considerably greater than the cost of the circuit itself. In particular, for the military market, the cost of providing the very demanding packaging and mounting that is required can be a very substantial portion of the total cost. If a circuit cannot be tested before the packaging step, then a defective circuit means a wasted package. The same cost considerations apply to large multipin packages used for gate arrays and other custom or semicustom circuits.

The invention relates to a method and apparatus for using the "flip-chip" bonding technique together with a TAB mounting system and a double-sided tape having particular pattern of metal suitable for providing convenient test pins to facilitate the testing of an integrated circuit or a system comprising integrated circuits in other devices before the expensive packaging step is performed.

Figure 1:
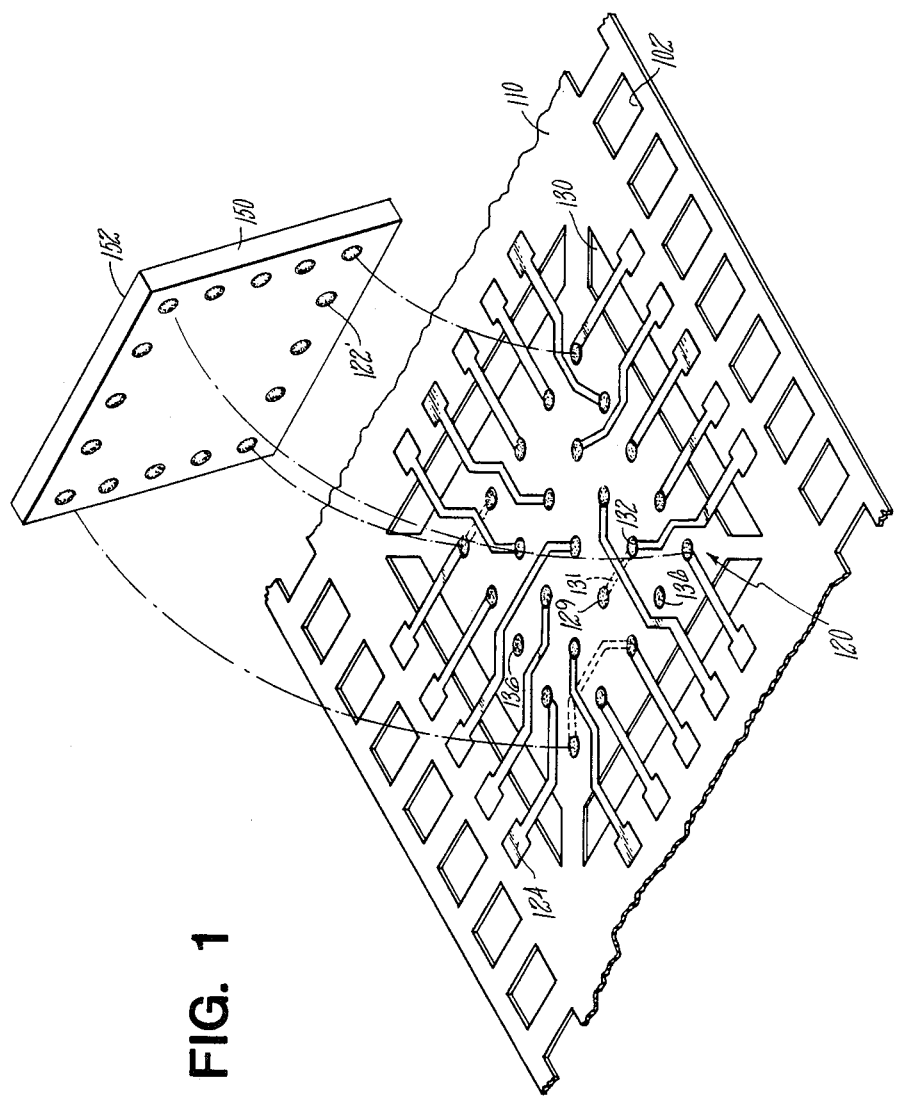
FIG. 1 illustrates in perspective form an embodiment of the invention.

Referring now to FIG. 1, there is shown in perspective, exploded form an embodiment of the invention in which a segment of a tape 110 having sprocket holes 102 on either side to provide for convenient transport is shown, together with a pattern of metal leads suitable for providing connections for integrated circuit 150. Circuit 150 is shown displaced from its final position and comprising substrate 152 and an array of solder bumps collectively denoted by the numeral 122'. These bumps 122' mate with a matching array of metal connections referred to as input/output contacts 120 which are illustratively plated through-holes extending from the top of tape 110 to the bottom side. On the top of tape 110, there is an array of test leads having test pads at the outer edge denoted by the numeral 124. These test pads illustratively cross gaps 130 cut in tape 110.

These gaps 130 provide for a convenient method of shearing off leads 124 and also serve to provide stress relief for the central portion of tape 110. On the bottom side of tape 110, there is a set of metal connectors a few of which are denoted by the numerals 136 for an isolated through-hole that is not used in this embodiment; numeral 129 illustrates a metal contact on the bottom of tape 110 that is connected by a metal strip 131, also on the bottom, to through hole 132.

Integrated circuit 150 is placed in alignment with the lead array 120 by conventional means and is then bonded to leads 120 by a conventional process that is not thermo-compression bonding, such as vapor reflow bonding. The test leads 124 provide for convenient connections to selected ones of solder bumps 122' so that the integrated circuit may be tested while it is still mounted on the tape and before it is placed in a package. Test leads 124 may include contacts to internal parts of the circuit that are not connected to the final pins, thereby facilitating testing. Those chips that fail a test may be suitably marked so that no money is wasted by packaging a defective chip within an expensive container. The testing process is conventional and is well known to those skilled in the art.

The metal connectors on the bottom of tape 110 are connected to pins in the package (which is not shown) by any convenient method such as a second step of reflow bonding. No particular method of forming a connection between the pins on the package and the leads on the bottom side of tape 110 is required by the invention and any number of methods known to those skilled in the art will be satisfactory. Also, no particular form of connector array is required for use of the invention. It is an advantageous feature of the invention, indeed, that the use of two layers of metal on tape 110 provides for great flexibility in accomodating a convenient pattern of connectors on the chip with a standard array of pins in the package.

Figure 2:
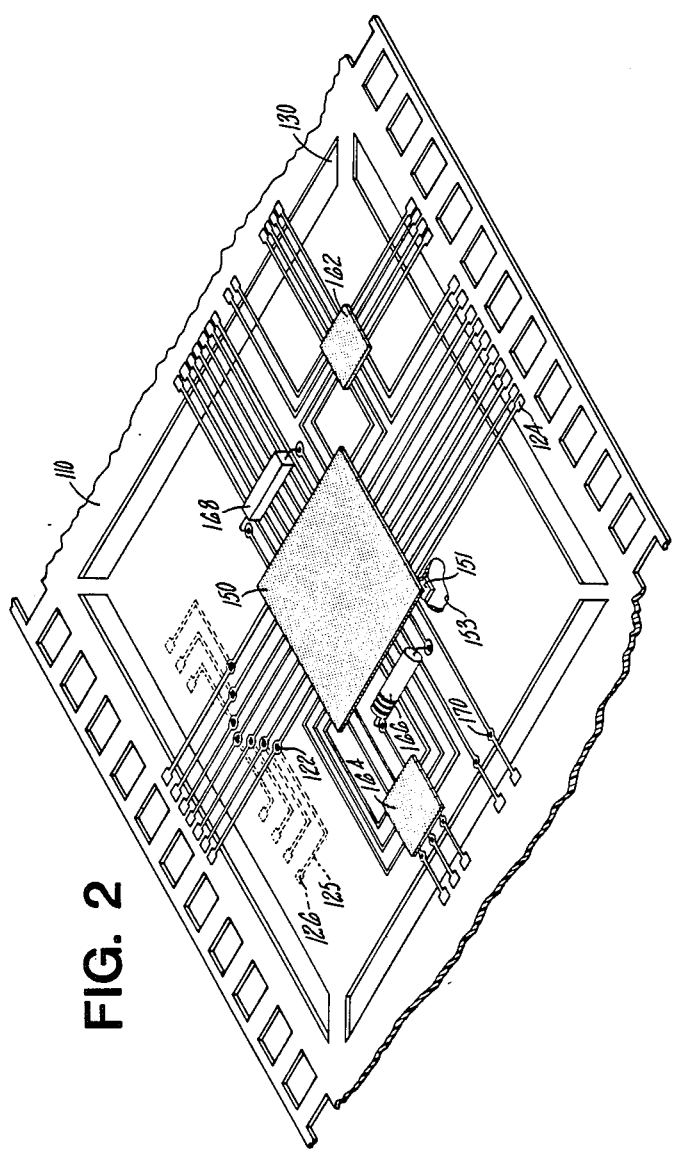
FIG. 2 illustrates an alternative embodiment of the invention in which integrated circuits are mounted on both sides of a tape.

Referring now to FIG. 2, there is shown an alternate embodiment of the invention in which like features have the same numeral as in FIG. 1. Integrated circuit 150 now has a counterpart integrated circuit 151 mounted on the bottom side of tape 110. A corner of circuit 151 may be seen through cutout portion 153 of tape 110. The two circuits 150 and 151 may share common contacts by being bonded to the same through holes or they may have staggered contacts so that they are electrically isolated from one another. The common contact arrangement would be used in the case of two memory chips, for example, in which both chips would share a common bus, each chip being responsive to an address or other identifying feature. A set of two other chips 162 and 164 as well as resistor 166 and inductor 168 are shown as being soldered or otherwise bonded to leads on the top surface of tape 110. Some of all of these accessory chips could just as easily be bonded on the bottom surface. Test leads 124 are shown as in FIG. 1.

Two alternate versions of leads suitable for contact with a package are shown. On the lower left side of the tape, there is an array of through holes denoted by the numeral 170 in which an electrical connection is formed from the leads going to test pins 124 through tape 110 to the bottom side, suitable for soldering to electrical contacts in the package. These five contacts are disposed at irregular intervals, so that they would skip some pins or else require a nonstandard package. On the upper left side of the array, there is an alternate version in which through-holes 122 are provided in the interior of the leads going to the test pins and an array of metal strips 125 are formed on the bottom side of tape 110 going to an array of metal contacts 126 in a standard peripheral array suitable for use with a standard package. The testability referred to in the discussion of FIG. 1 also applies to this embodiment.

Figure 3:
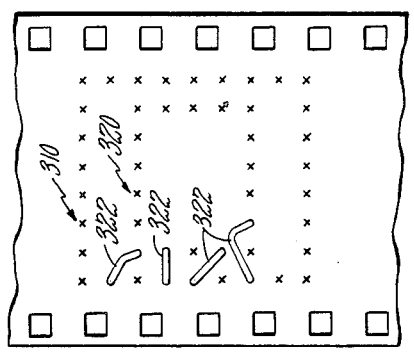
FIG. 3 illustrates an alternative tape suitable for use in a system constructed according to the invention.

Referring now to FIG. 3, there is shown a tape 110 viewed from the bottom and having a set of two rectangular connector arrays. Integrated circuits and/or other devices are omitted from this drawing for clarity. An outer array 310 and an inner array 320 are shown with connections 322 between the two arrays. This sort of contact array may be used in several different situations. In a first instance, array 310 is matched to a standard pin arrangement in a standard package. A large integrated circuit may be placed on the top side of the tape 110 and bonded to some or all of the through holes in array 310. Alternatively, a smaller integrated circuit that is not large enough to reach the elements of array 310 may be bonded to array 320, some pins of which are connected to some of the contacts 310 by means of the metal strips 322. It is not necessary, of course, that all the contacts in array 310 be used; nor is it necessary that all contacts in array 320 be used. The metal strips 322 may be placed on the top or the bottom of the tape and may form cross-over connections, as is known in the art. A particular advantage of this system is that a number of chips having a contact array matching array 320 may be used and connected to a number of different pin-out arrangements using array 310. i.e. the different pins in array 310 may be used for different functions or for different types of chips, such as memory chips, processor controller chips and the like, by means of a customizing feature of the metal strips 322 which can produce essentially any desired connection between the pins 320 and the contacts 310. The arrays 310 and 320 need not be the same shape or have one enclosed within the other.

There is an important economic advantage in this system in that it can cost a great deal of money to have a tape fabricated with a particular metal pattern. The use of a number of different circuits with the same tape provides an evident cost saving. Similarly, there is an advantage to adapting a single chip having a pin-out of size matching array 320 to two or more different pin-outs 310 to take advantage of different pin-out combinations that different end users have committed to. In such a case, the extra cost of a custom tape would be less than the cost of redoing the layout on the integrated circuit in order to adapt it to two different pin-outs.

In addition to the cost savings mentioned above, there is a saving in design time that results from the great flexibility in layout. Considerably less effort will be needed to place circuit elements of an integrated circuit chip where it will be possible to route all the leads to all the right pins.

In the particular case of a set of gate-array integrated circuits, the invention affords the possiblity of significantly reducing the number of interconnects of the package level in a multichip system. For example, a 1000 gate device requires approximately 1000 pins if no interconnect is used within the integrated circuit. If four such devices are to be interconnected according to the invention, in an embodiment similar to that of FIG. 2, then Rentz' rule applies, and the number of I/Os=4.5×Square Root (Number of Gates); or four 1000 gate devices would need 285 I/Os. In any particular case, there might be interconnections with the integrated circuits and more or less pins required at the package level, but the magnitude of possible savings is evident.

The invention disclosed herein may be employed in a number of different embodiments that will be apparent to those skilled in the art, in the light of this disclosure. In particular, no particular package type or lead array is necessary for the practice of this invention. The invention may be practiced with ceramic packages or with any other packaging or encapsulating technique. The term "encapsulating", as used in this specification, includes placing material about a circuit and solidifying it, as well as sealing a ceramic or other package.

We claim:

1. An electronic system for inserting in a package comprising at least one integrated circuit chip having chip electrical contacts formed, in a first chip surface thereof, a dielectric support member, having a network of conductive lines thereon, at least some of said network of conductive lines in a connector array on a first support side of said dielectric support member being connected to at least some of said chip electrical contacts;

characterized in that:

said chip electrical contacts are non-compression bonded to said network of conductive lines at locations in said network of conductive lines that are located on said support side and are supported by said dielectric support member, whereby said first chip surface and said first support side face one another so that access to said chip electrical contacts is not possible, which network includes a group of test pad contacts disposed on said support member and being displaced from said integrated circuit chip and a group of input/output contacts, whereby said at least one integrated circuit chip may be tested before said input/output contacts are connected to said package.

2. A system according to claim 1, further characterized in that said dielectric support member is a flexible carrier tape; said at least one integrated circuit includes at least one circuit on a first side of said carrier tape and at least one circuit on a second side of said carrier tape.

3. A system according to claim 1, further characterized in that said input/output contacts are located within a central portion of said network of conductive lines, and test pad contacts extend outwardly from said central portion of said network of conductive lines over an aperture in said carrier tape to a corresponding outer test pad contact, whereby said test pad contacts may be severed from that portion of said electronic system that is inserted in said package.

4. An electronic system according to claim 1, further characterized in that said network of conductive lines includes a first connector array and a second connector array also on said first support side and overlapping said first connector array, said first and second connector arrays being connected to portions of the same group of input/output contacts, whereby the same dielectric substrate may be used with chips matching either of said first or second connector arrays.

5. An electronic system according to claim 4, further characterized in that said second connector array is enclosed within said first connector array.

* * * * *